(12) United States Patent
Lebron et al.

(10) Patent No.: US 10,939,537 B1
(45) Date of Patent: Mar. 2, 2021

(54) PRINTED CIRCUIT BOARD ASSEMBLY EMBEDDED THERMAL MANAGEMENT SYSTEM USING THIN-FILM THERMOELECTRIC COOLERS

(71) Applicant: Honeywell International Inc., Morris Plains, NJ (US)

(72) Inventors: Pedro Luis Lebron, San Antonio, PR (US); Alejandro José Fernández, Isabela, PR (US)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 16/720,835

(22) Filed: Dec. 19, 2019

(51) Int. Cl.
| | |
|---|---|
| H05K 1/02 | (2006.01) |
| H05K 1/18 | (2006.01) |
| H05B 1/00 | (2006.01) |
| H05B 3/02 | (2006.01) |
| H05B 3/28 | (2006.01) |
| H01L 23/34 | (2006.01) |
| H01L 23/38 | (2006.01) |
| H01L 23/498 | (2006.01) |

(52) U.S. Cl.
CPC ......... *H05K 1/0203* (2013.01); *H05K 1/0212* (2013.01); *H05K 2201/10151* (2013.01); *H05K 2201/10219* (2013.01)

(58) Field of Classification Search
CPC .......... H05K 1/02; H05K 1/18; H05K 1/0212; H05K 1/0263; H05K 1/181; H05K 1/167; H05K 1/185; H05B 1/00; H05B 3/02; H05B 3/28; H01L 23/34; H01L 23/38; H01L 23/345; H01L 23/498

USPC ................... 361/748; 219/209; 136/204; 1/1
See application file for complete search history.

(56) References Cited

U.S. PATENT DOCUMENTS

| | | |
|---|---|---|
| 5,040,381 A | 8/1991 | Hazen |
| 6,337,228 B1 | 1/2002 | Juskey et al. |
| 9,750,158 B2 | 8/2017 | Strickland et al. |
| 2003/0178403 A1* | 9/2003 | Lemmerhirt ............ B81C 3/008 219/209 |
| 2006/0000500 A1 | 1/2006 | Sauciuc et al. |

(Continued)

FOREIGN PATENT DOCUMENTS

KR    100769527 B1    10/2007

OTHER PUBLICATIONS

Lee, "Embedded thermoelectrics: Cooling ICs in harsh environments", Hardware: ABCs of Cooling/Chassis, 2008, pp. 1-4, OpenSystems Publishing.

*Primary Examiner* — Xiaoliang Chen
(74) *Attorney, Agent, or Firm* — Fogg & Powers LLC

(57) ABSTRACT

Systems and methods for a printed circuit board assembly comprising a thermoelectric device at least partially embedded within the printed circuit board assembly are provided. The thermoelectric device is configured to adjust a temperature of the printed circuit board assembly based on the measurements of one or more sensors coupled to the printed circuit board assembly. Additionally, a control circuit is coupled to the at least one thermoelectric device and the one or more sensors, wherein the control circuit is configured to control the at least one thermoelectric device, and wherein the control circuit is configured to monitor a temperature set point at one or more target locations in the printed circuit board assembly.

15 Claims, 3 Drawing Sheets

(56) References Cited

U.S. PATENT DOCUMENTS

| | | | |
|---|---|---|---|
| 2010/0243634 A1* | 9/2010 | So | H05K 1/0212 |
| | | | 219/209 |
| 2010/0288535 A1 | 11/2010 | Hong et al. | |
| 2013/0180973 A1* | 7/2013 | White | H05K 7/20 |
| | | | 219/209 |
| 2013/0192655 A1* | 8/2013 | Edwards | H05K 1/185 |
| | | | 136/204 |
| 2014/0298825 A1 | 10/2014 | Noshadi | |
| 2015/0135861 A1* | 5/2015 | Cook | G01N 30/30 |
| | | | 73/863.12 |
| 2017/0272081 A1* | 9/2017 | Chiang | H01L 23/345 |

* cited by examiner

PRINTED CIRCUIT BOARD ASSEMBLY EMBEDDED THERMAL MANAGEMENT SYSTEM USING THIN-FILM THERMOELECTRIC COOLERS

BACKGROUND

Manufacturers and designers of modern electronic equipment are constantly pushed to improve the performance of their products to meet consumers demands. As hardware continues to advance, designers are placing a greater emphasis on thermal management to improve performance of their products. Extreme changes in temperature can fatally damage electronic circuits. As the temperature surrounding electronic circuits destabilizes outside a normal operating temperature range (usually by overheating via heat conduction), the affected hardware decreases in performance and can even lead to broken or faulty equipment if not treated properly. Thus, thermal management is typically used to attempt to maintain appropriate temperature and heat flux surrounding system hardware, and accordingly maintain adequate performance standards.

Many electronic systems include printed circuit board assemblies (hereinafter "PCBA"). Current PCBAs attempt to remedy this temperature dilemma through bonding thermoelectric coolers on a surface of the printed circuit board (hereinafter "PCB"), usually coupled to a heat sink. Two problems arise with this approach. First, thermoelectric cooling devices can be bulky in size relative to the surface area of the PCB, which causes a reduction in available real estate on the PCB. This creates a fundamental conflict with the compactness the PCB is designed to provide. A second problem occurs due to the inefficiency of heat transfer through the PCB when implementing a thermoelectric cooler on the outer layer of the PCB. Depending on the placement of circuit elements, a thermoelectric cooler placed on the outer layer of the PCB can be far away from high heat generating devices with limited pathways to transfer heat through the various layers of the PCB, resulting in ineffective thermal management.

Therefore, there is a need to provide improved thermal management to an electronic system with a printed circuit board while increasing the available space on the PCB and improving PCBA performance.

SUMMARY

In one embodiment, a printed circuit board assembly is provided. The printed circuit board assembly comprises a first layer and a second layer, wherein the first layer has a first side and a second side, and wherein the second layer has a first side and a second side. Additionally, one or more sensors is formed on or embedded in at least one of the first layer and the second layer, wherein the one or more sensors are configured to measure a temperature of the printed circuit board assembly. Additionally, the printed board assembly comprises at least one thermoelectric device having a first side and a second side, wherein the at least one thermoelectric device is configured to adjust the temperature of the printed circuit board assembly based on the measurements of the one or more sensors. A thermal epoxy couples the first side of the thermoelectric device to the second side of the first layer, and thermal epoxy couples the second side of the at least one thermoelectric device to the first side of the second layer. Furthermore, a control circuit is coupled to the at least one thermoelectric device and the one or more sensors, wherein the control circuit is configured to control the at least one thermoelectric device, and wherein the control circuit is configured to monitor a temperature set point at one or more target locations in the printed circuit board assembly.

In another embodiment, a system is provided. The system comprises a gyroscope and a printed circuit board assembly coupled to the gyroscope, wherein the printed circuit board assembly is configured to stabilize a performance parameter of the gyroscope. The printed circuit board assembly comprises a first layer and a second layer wherein the first layer has a first side and a second side, and wherein the second layer has a first side and a second side. Additionally, the printed circuit board assembly comprises one or more sensors formed on or embedded in at least one of the first layer and the second layer, wherein the one or more sensors are configured to measure a temperature of the printed circuit board assembly. Additionally, the printed circuit board assembly comprises at least one thermoelectric device having a first side and a second side, wherein the at least one thermoelectric device is configured to adjust the temperature of the printed circuit board assembly based on the measurements of the one or more sensors. A thermal epoxy couples the first side of the thermoelectric device to the second side of the first layer; and thermal epoxy couples the second side of the at least one thermoelectric device to the first side of the second layer. Furthermore, a control circuit is coupled to the at least one thermoelectric device and the one or more sensors, wherein the control circuit is configured to control the at least one thermoelectric device, and wherein the control circuit is configured to monitor a temperature set point at one or more target locations in the printed circuit board assembly.

In another embodiment, a method is provided. The method comprises determining a temperature of at least one target location corresponding to a printed circuit board assembly. Additionally, the method comprises comparing the determined temperature with a desired temperature range, wherein the desired temperature range corresponds to a performance property of a component coupled to the printed circuit board assembly f the comparison is less than the desired temperature range then warming the at least one target location; and if the comparison is greater than the desired temperature range then cooling the at least one target location.

The details of one or more embodiments are set forth in the description below. The features illustrated or described in connection with one exemplary embodiment may be combined with the features of other embodiments. Thus, any of the various embodiments described herein can be combined to provide further embodiments. Aspects of the embodiments can be modified, if necessary to employ concepts of the various patents, applications and publications as identified herein to provide yet further embodiments.

BRIEF DESCRIPTION OF THE DRAWINGS

Exemplary features of the present disclosure, its nature and various advantages will be apparent from the accompanying drawings and the following detailed description of various embodiments. Non-limiting and non-exhaustive embodiments are described with reference to the accompanying drawings, wherein like labels or reference numbers refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. One or more embodiments are described hereinafter with reference to the accompanying drawings in which.

DETAILED DESCRIPTION

Figure 1:
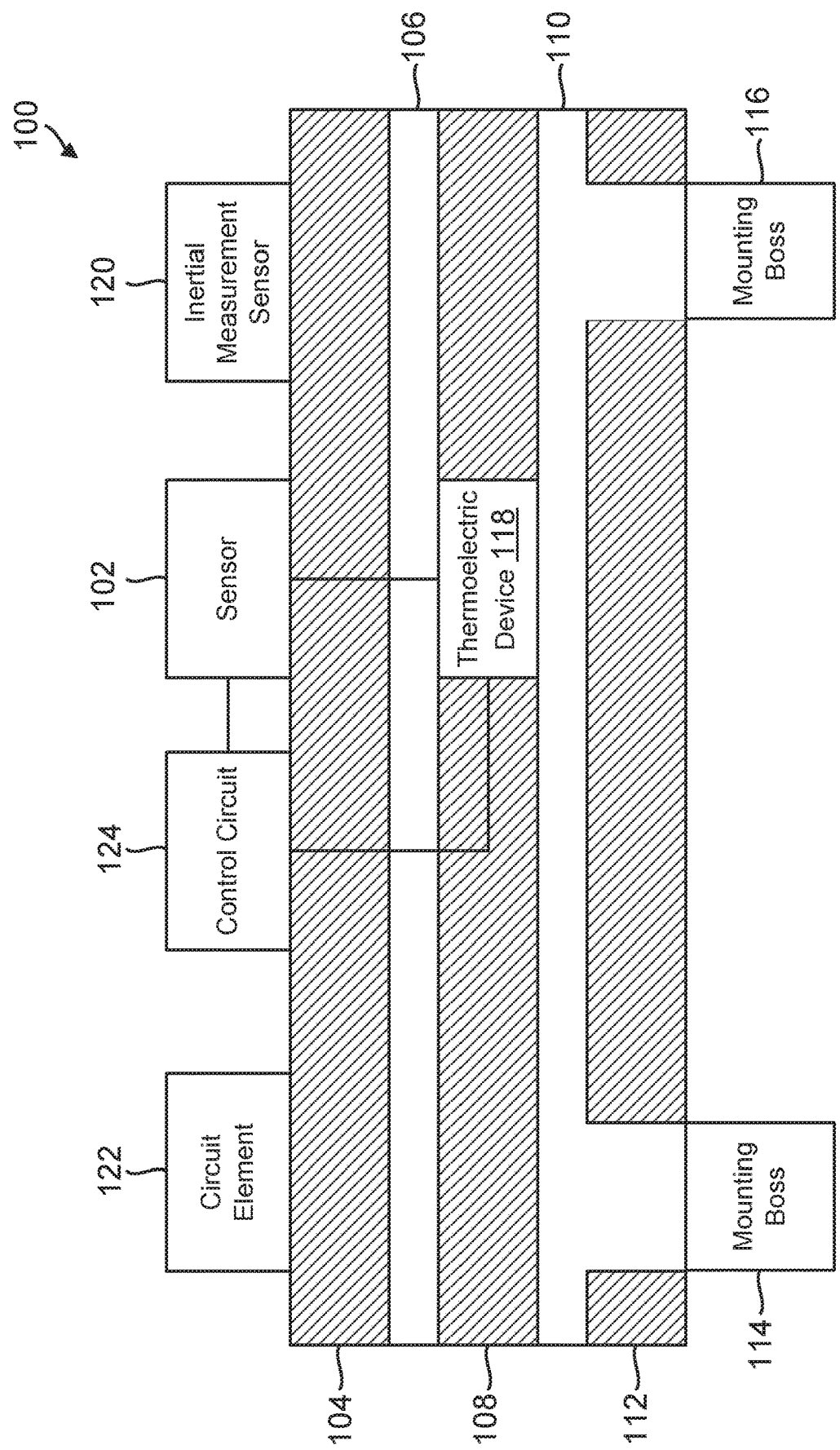
FIG. 1 depicts a side-view diagram of a printed circuit board including an embedded thermoelectric device and a control circuit, as illustrated in one embodiment of the present disclosure.

In the following detailed description, reference is made to the accompanying drawings that form a part hereof, and in which is shown by way of illustration specific illustrative embodiments. However, it is to be understood that other embodiments may be utilized, and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

The following disclosure is directed to improvements in printed circuit board assemblies. Specifically, embodiments of the present disclosure improve the functionality of the PCB by embedding a thermoelectric device, such as a thin-film thermoelectric cooler and/or heater, in the inner layers of the PCB to effectively manage heat flow through the circuit board and away from bonded circuit elements on the outer layers. This allows for more concentrated active heat management throughout an electronic system (such as by implementing thermoelectric devices in each PCB of the electronic system). Additionally, the described embodiments facilitate improved circuit element performance by maintaining a stable temperature surrounding the PCB. These circuit elements may include, for example, environmental sensors designed to determine vehicle position (such as an inertial measurement unit onboard an aircraft). The use of an environmental sensor is provided by way of example and not by way of limitation. In other embodiments, the circuit elements include processors, memory, ASICs, and any other appropriate electronic component that can be attached to a PCB in an electronic system.

An example configuration of a printed circuit board assembly is displayed in FIG. 1. Printed circuit board assembly (PCBA) 100 includes outer layers 104 and 112 (shown in crosshatch), intermediate layer 108 (also shown in crosshatch), and conductive layers 106 and 110. Outer layers 104, 112, and intermediate layer 108 are also collectively referred to as substrate layers throughout this disclosure. Conductive layers 106 and 110 are composed of a thermally and/or electrically conductive material, such as a copper foil. Intermediate layer 108 may also include a dielectric layer that is approximately the same thickness as at least one thermoelectric device 118 and includes a cutout portion the approximate size of thermoelectric device 118. Although FIG. 1 illustrates a multilayer PBC, one skilled in the art will recognize that principles of the present disclosure also apply to a single-layer PBC, or to a multi-layered PBC including additional substrate and conductive layers. Further, although only a single thermoelectric device 118 is shown in FIG. 1, it is understood that more than one thermoelectric device 118 may be implemented in a particular application at locations selected to provide effective thermal management for the PCBA 100.

The PCB in FIG. 1 is designed to bond to at least one circuit element 122 on outer layer 104 or 112, or which may be partially or completely embedded in intermediate layer 108 via manufacturing techniques known in the art. Circuit element 122 can include any class of analog or digital circuit components known in the art, such as resistors, capacitors, transistors, logic gates, field programmable gate arrays (FPGA), and other like elements. Furthermore, although FIG. 1 only displays a single sensor, one skilled in the art will recognize that PCBA 100 can hold multiple sensors bonded to the outer layers or embedded within intermediate layer 108. Additionally, in one embodiment, one or more inertial measurement sensors 120 may be bonded to outer layers 104 or 112, or may be completely or partially embedded in intermediate layer 108. The positions of circuit element 122, control circuit 124, sensor 102, and inertial measurement sensor 120 can be rearranged as necessary depending on the precise application of PCBA 100. In addition, in other embodiments, inertial measurement sensor 120 can be replaced with other types of sensors, such as acoustic, electrical, chemical, environmental, optical, or other navigation sensors, to meet the needs of another circuit application.

Circuit element 122 generates heat that if left unchecked, can cause the surrounding temperature of the PCBA 100 to rise and consequently cause lower performance and damage to components such as circuit element 122 or inertial measurement sensor 120. To avoid excessive temperature fluctuation and stabilize circuit element 122, thermoelectric device 118 is partially or completely embedded in intermediate layer 108 and configured to direct heat flow away from concentrated areas in the PCB. In one embodiment, thermoelectric device 118 directs heat flow via the Peltier or Seebeck effect, which converts changes in temperature (e.g. heat flux) into electric potential and accordingly shifts the temperature gradient from one junction to another. Thus, thermoelectric device 118 can include any circuit or device suitable for Peltier or Seebeck heat transfer, including a thermoelectric cooler, thermoelectric generator, thermoelectric circuit, thermocouple, or in one embodiment, a thermoelectric heater. In another embodiment, thermoelectric device 118 includes a thin-film thermoelectric cooler or heater. Thermoelectric device 118 is thermally and/or electrically coupled to intermediate layer 108 and may include an outer layer of thermal epoxy to provide this necessary coupling to outer layers 104 or 112.

To detect temperature change of PCBA 100, one or more sensors 102 coupled to thermoelectric device 118 measures the surrounding temperature. Sensor 102 may include a thermo-detector sensor or circuit, or in one embodiment, includes a resistance temperature detector. Sensor 102 is bonded to outer layer 104 or 112, or may be partially or completely embedded in intermediate layer 108. Sensor 102 feeds temperature measurements to control circuit 124 coupled to sensor 102 and thermoelectric device 118, which is configured to control the operation of thermoelectric device 118 and monitor heat flux at various target points in PCBA 100. For example, if sensor 102 detects a temperature increase, sensor 102 sends the temperature measurement data to control circuit 124, which is configured to adjust thermoelectric device 118 such that it transfers heat away from a concentrated target point (e.g. circuit element 122) and direct it through conductive layers 106 or 110 to mounting boss 114 or 116. Mounting boss 114 or 116 absorbs the heat transfer where it may then be cooled via techniques known in the art (such as by a fan which directs heat away from PCBA 100), In one embodiment, control circuit 124 includes a proportional-integral-derivative circuit. In another embodiment, control circuit 124 includes a pulse-width-modulator circuit.

However, in some instances it may be advantageous to provide additional heat to target points of PCBA 100, rather than to transfer it away. An example situation arises where PCBA 100 is coupled to a system located in a frigid environment, where it may take time to set the desired temperature suitable for system performance. In another embodiment, thermoelectric device 118 includes a thermoelectric heater designed to transfer heat to circuit element 122 or to other specified areas of PCBA 100. In this embodiment, sensor 102 detects a temperature decrease, which causes control circuit 124 to direct thermoelectric device 118 to shift heat flow through conductive layer 106 to wherever heat is needed.

Advantages of implementing the embodiments described above include the ability to stabilize essential electronics components from slight or extreme fluctuations in temperature, thereby allowing systems implementing these embodiments to function in a wide variety of environments. Additionally, embedding thermoelectric device 118 and/or control circuit 124 provides increased space to PCBA 100 for the addition of other components and may allow for easier configuration of printed circuit board assemblies within a system.

Figure 2:
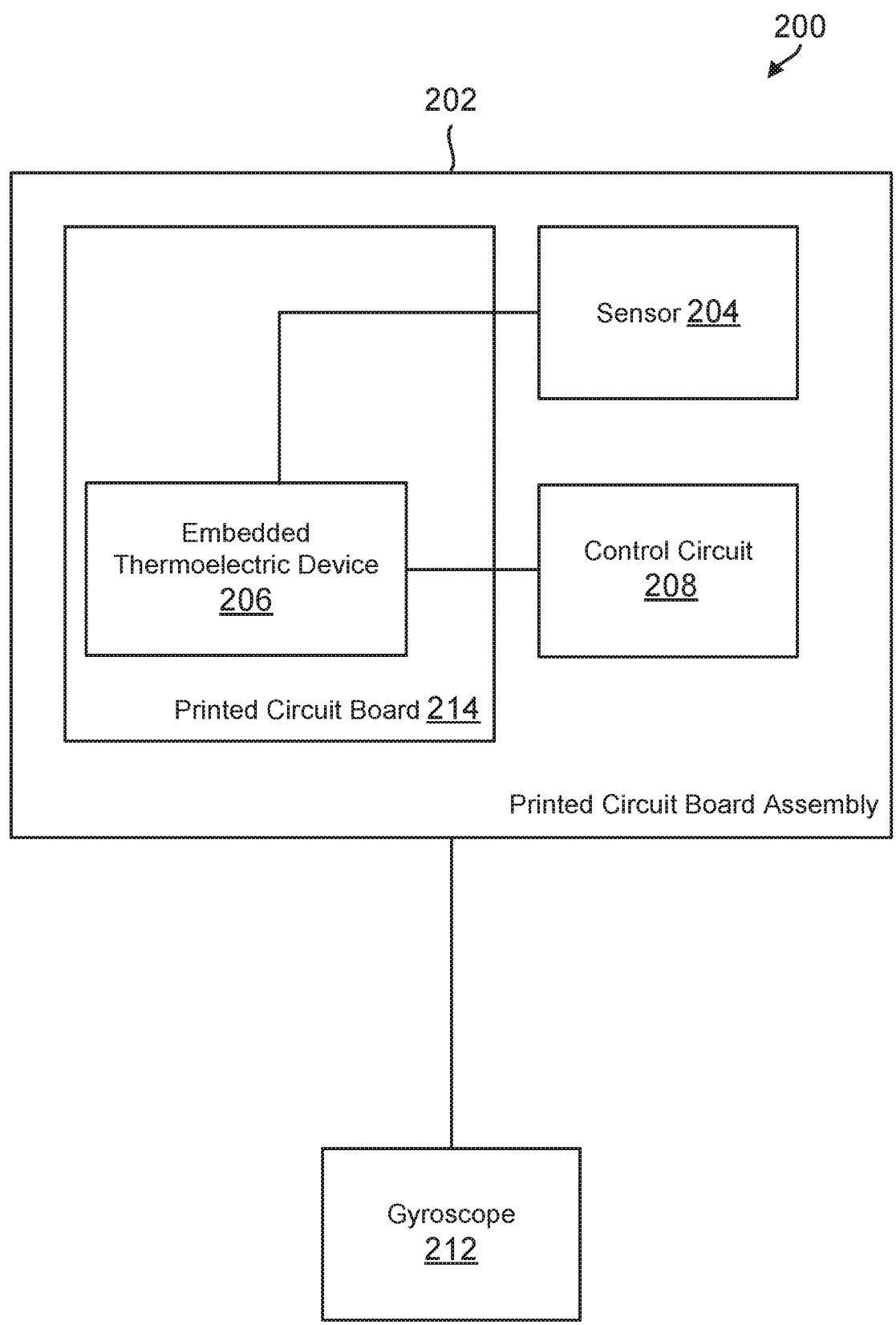
FIG. 2 depicts a block diagram of a system with a printed circuit board assembly coupled to a gyroscope, wherein the PCBA includes an embedded thermoelectric device and an accompanying control circuit, as illustrated in one embodiment of the present disclosure.

FIG. 2 provides an illustration of the benefits described above to a particular system. In FIG. 2, printed circuit board assembly 202 includes printed circuit board 214, embedded thermoelectric device 206, control circuit 208, and sensor 204. Thermoelectric device 206, control circuit 208, and sensor 204 function identically as described with respect to FIG. 1. However, PCBA 202 is also coupled to gyroscope 212, such as a Micro-Electro-Mechanical Systems (hereinafter "MEMS") or optical gyroscope. In this embodiment, gyroscope 212 generates heat during active operation, which causes the temperature in system 200 to increase. Sensor 204 measures this temperature fluctuation and sends data to control circuit 208, which directs thermoelectric device 206 to transfer heat flow away from gyroscope 212 and to a designated target location of PCB 214, where it can be absorbed and discarded using techniques known in the art. Thermoelectric device 206 may also be configured to direct heat flow towards gyroscope 212 in a situation where the system temperature decreases beyond acceptable levels. In this respect, PCB 214 stabilizes temperature of the gyroscope, which allows for improved bias stability, performance, and gyroscope durability. This advantage can be particularly useful in INS systems that experience a wide variety of temperature and pressure fluctuations from environments explored by air, space, and water vehicles.

Figure 3:
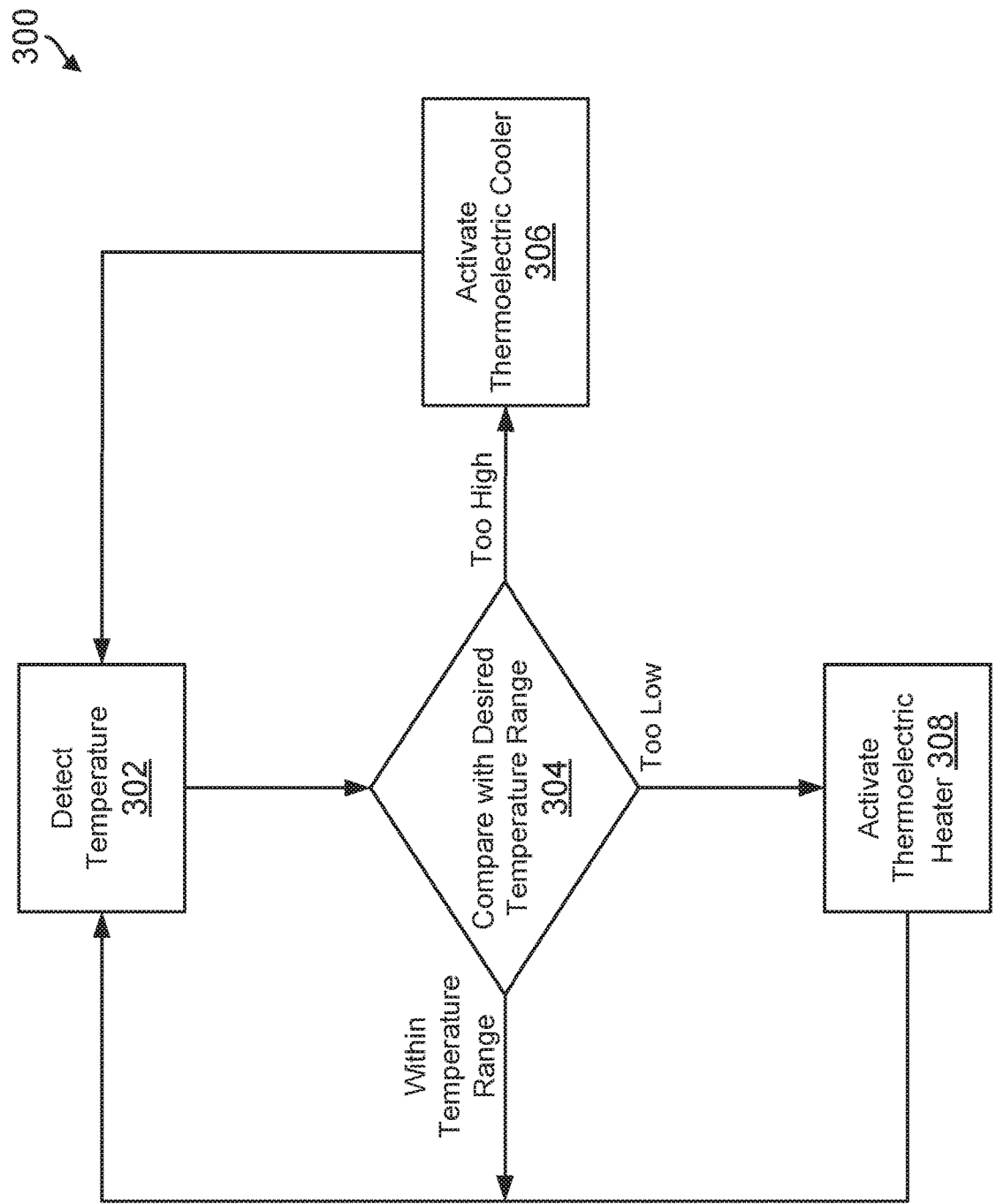
FIG. 3 depicts a method for controlling the temperature of a printed circuit board assembly using an embedded thermoelectric device, as illustrated in one embodiment of the present disclosure.

FIG. 3 illustrates a process 300 for controlling heat flux through a printed circuit board assembly, which may be accomplished using the embodiments presented above. Process 300 begins at step 302 by determining or detecting a temperature of at least one target location corresponding to a printed circuit board assembly. A target location may include any point or points of interest to regulate temperature in the printed circuit board assembly, or may be the temperature of the PCBA itself. Depending on the particular embodiment, a target location may include the areas where important circuit or system components (such as circuit element 122 of FIG. 1 or gyroscope 212 of FIG. 2) are located to prevent temperature destabilization of these components. Temperature determination can be made via a temperature detector sensor (such as sensor 102 of FIG. 1), or by various other techniques known in the art.

Process 300 then moves to step 304 where the determined temperature is compared with a desired temperature range. The desired temperature range can be selected based on a variety of system or environmental factors. In one embodiment; the desired temperature range can be selected based on the ambient temperature of the surrounding environment in which the PCBA is inserted. In another embodiment, the desired temperature range is selected based a performance property of at least one circuit or system component coupled to, bonded on, or embedded within the PCBA, such as component durability; operation speed, and power specifications.

Subsequent steps of process 300 depend on the results of the comparison between the determined temperature and the desired temperature range. If the results determine that the determined temperature lies within the desired temperature range, then process 300 may continue to monitor target locations of the PCBA with periodic temperature measurements until the determined temperature lies outside of the desired temperature range. When that situation occurs, process 300 diverges into one of two paths. If the determined temperature is less than the desired temperature range, then process 300 moves to step 308, where an embedded thermoelectric heater is activated, which is configured to warm the at least one target location at least until the temperature at the target location rises within the desired temperature range. In contrast, if the determined temperature is too high relative to the desired temperature range, then process 300 moves to step 306; where an embedded thermoelectric cooler is activated, which is configured to cool the at least one target location at least until the temperature at the target location falls within the desired temperature range. The thermoelectric devices used by process 300 can include those described above with respect to FIGS. 1 and 2. Furthermore, if a thermoelectric device executes process 300 via the Seebeck effect, then thermoelectric device may also be configured to generate power based on the heat transfer from the target location.

Example Embodiments

Example 1 includes a printed circuit board assembly, comprising: a first layer and a second layer wherein the first layer has a first side and a second side; and wherein the second layer has a first side and a second side; one or more sensors formed on or embedded in at least one of the first layer and the second layer, wherein the one or more sensors are configured to measure a temperature of the printed circuit board assembly; at least one thermoelectric device having a first side and a second side, wherein the at least one thermoelectric device is configured to adjust the temperature of the printed circuit board assembly based on the measurements of the one or more sensors, wherein a thermal epoxy couples the first side of the thermoelectric device to the second side of the first layer, and thermal epoxy couples the second side of the at least one thermoelectric device to the first side of the second layer; and a control circuit coupled to the at least one thermoelectric device and the one or more sensors, wherein the control circuit is configured to control the at least one thermoelectric device, wherein the control circuit is configured to monitor a temperature set point at one or more target locations in the printed circuit board assembly.

Example 2 includes the printed circuit board assembly of Example 1, wherein the at least one thermoelectric device comprises at least one of a thermoelectric cooler and thermoelectric heater.

Example 3 includes the printed circuit board assembly of any of Examples 1-2, wherein the at least one thermoelectric device comprises a thin-film thermoelectric cooler or thin-film thermoelectric heater.

Example 4 includes the printed circuit board assembly of any of Examples 1-3, further comprising an inertial measurement sensor formed on or embedded in at least one of the first layer and the second layer.

Example 5 includes the printed circuit board assembly of any of Examples 1-4, further comprising a dielectric layer between the first layer and the second layer, wherein the dielectric layer has a first side and a second side, wherein the dielectric layer is configured to be approximately the same thickness as the at least one thermoelectric device, and comprises a cutout portion the approximate size of the at least one thermoelectric device.

Example 6 includes the printed circuit board assembly of any of Examples 1-5, wherein the control circuit comprises a proportional-integral-derivative circuit.

Example 7 includes the printed circuit board assembly of any of Examples 1-6, wherein the one or more sensors comprises a resistance temperature detector.

Example 8 includes the printed circuit board assembly of any of Examples 1-7, wherein the control circuit comprises a pulse-width-modulator.

Example 9 includes a system, comprising: a gyroscope; and a printed circuit board assembly coupled to the gyroscope, wherein the printed circuit board assembly is configured to stabilize a performance parameter of the gyroscope, the printed circuit board assembly comprising: a first layer and a second layer wherein the first layer has a first side and a second side, and wherein the second layer has a first side and a second side; one or more sensors formed on or embedded in at least one of the first layer and the second layer, wherein the one or more sensors are configured to measure a temperature of the printed circuit board assembly; at least one thermoelectric device having a first side and a second side, wherein the at least one thermoelectric device is configured to adjust the temperature of the printed circuit board assembly based on the measurements of the one or more sensors, wherein a thermal epoxy couples the first side of the thermoelectric device to the second side of the first layer, and thermal epoxy couples the second side of the at least one thermoelectric device to the first side of the second layer; and a control circuit coupled to the at least one thermoelectric device and the one or more sensors, wherein the control circuit is configured to control the at least one thermoelectric device, wherein the control circuit is configured to monitor a temperature set point at one or more target locations in the printed circuit board assembly.

Example 10 includes the system of Example 9, wherein the at least one thermoelectric device comprises at least one of a thermoelectric cooler and thermoelectric heater.

Example 11 includes the system of any of Examples 9-10, wherein the at least one thermoelectric device comprises a thin-film thermoelectric cooler or thin-film thermoelectric heater.

Example 12 includes the system of any of Examples 9-11, further comprising an inertial measurement sensor formed on or embedded in at least one of the first layer and the second layer.

Example 13 includes the system of any of Examples 9-12; wherein the printed circuit board assembly further comprises a dielectric layer between the first layer and the second layer, wherein the dielectric layer has a first side and a second side; wherein the dielectric layer is configured to be approximately the same thickness as the at least one thermoelectric device, and comprises a cutout portion the approximate size of the at least one thermoelectric device.

Example 14 includes the system of any of Examples 9-13, wherein the control circuit comprises a proportional-integral-derivative circuit.

Example 15 includes the system of any of Examples 9-14, wherein the one or more sensors comprises a resistance temperature detector.

Example 16 includes a method, comprising: determining a temperature of at least one target location corresponding to a printed circuit board assembly; comparing the determined temperature with a desired temperature range, wherein the desired temperature range corresponds to a performance property of a component coupled to the printed circuit board assembly; if the comparison is less than the desired temperature range: warming the at least one target location; and if the comparison is greater than the desired temperature range: cooling the at least one target location.

Example 17 includes the method of Example 16, wherein warming the at least one target location further comprises warming the at least one target location via a thermoelectric heater at least partially embedded in the printed circuit board assembly, and wherein cooling the at least one target location further comprises cooling the at least one target location via a thermoelectric cooler at least partially embedded in the printed circuit board assembly.

Example 18 includes the method of Example 17, wherein the thermoelectric heater and thermoelectric cooler further comprise a respective thin-film thermoelectric heater and thin-film thermoelectric cooler.

Example 19 includes the method of any of Examples 16-18, further comprising generating power based on the warming or cooling of the at least one target location.

Example 20 includes the method of any of Examples 16-19, wherein the performance property comprises at least one of durability, operation speed, and power.

From the foregoing, it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated. Moreover, the circuit components described above may be disposed on a single or multiple integrated circuit (IC), one or more microprocessors, or one or more microcontrollers. In addition, one or more components of a described apparatus or system may have been omitted from the description for clarity or another reason. Furthermore, one or more components of a described apparatus or system that have been included in the description may be omitted from the apparatus or system.

What is claimed is:

1. A printed circuit board assembly, comprising:
   a first layer and a second layer wherein the first layer has a first side and a second side, and wherein the second layer has a first side and a second side;

one or more sensors formed on or embedded in at least one of the first layer and the second layer, wherein the one or more sensors are configured to measure a temperature of the printed circuit board assembly;

at least one thermoelectric device having a first side and a second side, wherein the at least one thermoelectric device is configured to adjust the temperature of the printed circuit board assembly based on the measurements of the one or more sensors, wherein a thermal epoxy couples the first side of the thermoelectric device to the second side of the first layer, and thermal epoxy couples the second side of the at least one thermoelectric device to the first side of the second layer; and a control circuit coupled to the at least one thermoelectric device and the one or more sensors, wherein the control circuit is configured to control the at least one thermoelectric device, wherein the control circuit is configured to monitor a temperature set point at one or more target locations in the printed circuit board assembly.

2. The printed circuit board assembly of claim 1, wherein the at least one thermoelectric device comprises at least one of a thermoelectric cooler and thermoelectric heater.

3. The printed circuit board assembly of claim 1, wherein the at least one thermoelectric device comprises a thin-film thermoelectric cooler or thin-film thermoelectric heater.

4. The printed circuit board assembly of claim 1, further comprising an inertial measurement sensor formed on or embedded in at least one of the first layer and the second layer.

5. The printed circuit board assembly of claim 1, further comprising a dielectric layer between the first layer and the second layer, wherein the dielectric layer has a first side and a second side, wherein the dielectric layer is configured to be approximately the same thickness as the at least one thermoelectric device, and comprises a cutout portion the approximate size of the at least one thermoelectric device.

6. The printed circuit board assembly of claim 1, wherein the control circuit comprises a proportional-integral-derivative circuit.

7. The printed circuit board assembly of claim 1, wherein the one or more sensors comprises a resistance temperature detector.

8. The printed circuit board assembly of claim 1, wherein the control circuit comprises a pulse-width-modulator.

9. A system, comprising:
a gyroscope; and
a printed circuit board assembly coupled to the gyroscope, wherein the printed circuit board assembly is configured to stabilize a performance parameter of the gyroscope, the printed circuit board assembly comprising:
a first layer and a second layer wherein the first layer has a first side and a second side, and wherein the second layer has a first side and a second side;
one or more sensors formed on or embedded in at least one of the first layer and the second layer, wherein the one or more sensors are configured to measure a temperature of the printed circuit board assembly;
at least one thermoelectric device having a first side and a second side, wherein the at least one thermoelectric device is configured to adjust the temperature of the printed circuit board assembly based on the measurements of the one or more sensors, wherein a thermal epoxy couples the first side of the thermoelectric device to the second side of the first layer, and thermal epoxy couples the second side of the at least one thermoelectric device to the first side of the second layer; and
a control circuit coupled to the at least one thermoelectric device and the one or more sensors, wherein the control circuit is configured to control the at least one thermoelectric device, wherein the control circuit is configured to monitor a temperature set point at one or more target locations in the printed circuit board assembly.

10. The system of claim 9, wherein the at least one thermoelectric device comprises at least one of a thermoelectric cooler and thermoelectric heater.

11. The system of claim 9, wherein the at least one thermoelectric device comprises a thin-film thermoelectric cooler or thin-film thermoelectric heater.

12. The system of claim 9, further comprising an inertial measurement sensor formed on or embedded in at least one of the first layer and the second layer.

13. The system of claim 9, wherein the printed circuit board assembly further comprises a dielectric layer between the first layer and the second layer, wherein the dielectric layer has a first side and a second side, wherein the dielectric layer is configured to be approximately the same thickness as the at least one thermoelectric device, and comprises a cutout portion the approximate size of the at least one thermoelectric device.

14. The system of claim 9, wherein the control circuit comprises a proportional-integral-derivative circuit.

15. The system of claim 9, wherein the one or more sensors comprises a resistance temperature detector.

* * * * *